US007085706B1

(12) United States Patent
McGettigan et al.

(10) Patent No.: US 7,085,706 B1
(45) Date of Patent: Aug. 1, 2006

(54) SYSTEMS AND METHODS OF UTILIZING VIRTUAL INPUT AND OUTPUT MODULES IN A PROGRAMMABLE LOGIC DEVICE

(75) Inventors: Edward S. McGettigan, San Jose, CA (US); Bradley K. Fross, Claremont, CA (US); Michael E. Peattie, Campbell, CA (US)

(73) Assignee: Xilinx, Inc., San Jose, CA (US)

( * ) Notice: Subject to any disclaimer, the term of this patent is extended or adjusted under 35 U.S.C. 154(b) by 752 days.

(21) Appl. No.: 10/342,808

(22) Filed: Jan. 14, 2003

(51) Int. Cl.
*G06F 9/455* (2006.01)
(52) U.S. Cl. ........................................ 703/24; 326/41
(58) Field of Classification Search ................ 703/24, 703/28; 326/39, 41, 47; 710/104; 716/16
See application file for complete search history.

(56) References Cited

U.S. PATENT DOCUMENTS

| | | | | |
|---|---|---|---|---|
| 4,910,417 A | * | 3/1990 | El Gamal et al. ............. | 326/41 |
| 5,535,406 A | * | 7/1996 | Kolchinsky ................... | 712/10 |
| 5,995,744 A | | 11/1999 | Guccione | |
| 6,144,933 A | | 11/2000 | Guccione | |
| 6,182,247 B1 | | 1/2001 | Herrmann et al. | |
| 6,212,650 B1 | | 4/2001 | Guccione | |
| 6,239,387 B1 | * | 5/2001 | Wissell ........................ | 174/262 |
| 6,311,149 B1 | | 10/2001 | Ryan et al. | |
| 6,889,172 B1 | * | 5/2005 | Sierer et al. ................. | 702/188 |
| 6,961,691 B1 | * | 11/2005 | Selvidge et al. .............. | 703/28 |
| 2002/0055834 A1 | | 5/2002 | Andrade et al. | |

OTHER PUBLICATIONS

Xilinx, Inc.; ChipScope Software and ILA Cores User Manual (ChipScope Software v4.1i); Oct. 19, 2001; available from Xilinx, Inc., 2100 Logic Drive, San Jose, California 95124; pp. 1-1 thru 4-28.

Paul S. Graham; "Logical Hardware Debuggers for FPGA-Based Systems"; A dissertation submitted to the faculty of Brigham Young University; Department of Electrical and Computer Engineering; Dec. 2001; pp. 1-246.

* cited by examiner

*Primary Examiner*—Albert W. Paladini
(74) *Attorney, Agent, or Firm*—Lois D. Cartier

(57) ABSTRACT

Systems and methods utilizing virtual input/output (VIO) modules in PLDS. One or more VIO modules are embedded in a PLD along with the user circuit to be controlled and monitored. The VIO module includes a control module that acts as a virtual input module for the user circuit, and can optionally include a status module that acts as a virtual output module for the user circuit. A bi-directional data interface is provided between the user circuit and the VIO modules, and between the VIO modules and a communication module. The communication module is coupled through input/output pads of the PLD to an external communication link, and hence to a host computer in which resides software that controls the communication link. Thus, by interfacing with the host computer, a user can control the user circuit via the control modules and monitor output signals from the user circuit via the status modules.

41 Claims, 7 Drawing Sheets

SYSTEMS AND METHODS OF UTILIZING VIRTUAL INPUT AND OUTPUT MODULES IN A PROGRAMMABLE LOGIC DEVICE

FIELD OF THE INVENTION

The invention relates to programmable logic devices (PLDs). More particularly, the invention relates to systems and methods of utilizing virtual control input and status output modules in PLDs.

BACKGROUND OF THE INVENTION

Programmable logic devices (PLDs) are a well-known type of digital integrated circuit that can be programmed to perform specified logic functions. One type of PLD, the field programmable gate array (FPGA), typically includes an array of configurable logic blocks (CLBs) surrounded by a ring of programmable input/output blocks (IOBs). The CLBs and IOBs are interconnected by a programmable interconnect structure. Some FPGAs also include additional logic blocks with special purposes (e.g., DLLs, RAM, and so forth).

The CLBs, IOBs, interconnect, and other logic blocks are typically programmed by loading a stream of configuration data (bitstream) into internal configuration memory cells that define how the CLBs, IOBs, and interconnect are configured. The configuration data can be read from memory (e.g., an external PROM) or written into the FPGA by an external device. The collective states of the individual memory cells then determine the function of the FPGA.

One such FPGA, the Xilinx Virtex®-II FPGA, is described in detail in pages 33–75 of the "Virtex-II Platform FPGA Handbook", published December, 2000, available from Xilinx, Inc., 2100 Logic Drive, San Jose, Calif. 95124, which pages are incorporated herein by reference. (Xilinx, Inc., owner of the copyright, has no objection to copying these and other pages referenced herein but otherwise reserves all copyright rights whatsoever.)

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static RAM cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as ASIC devices (Application Specific Integrated Circuits). PLDs can also be implemented in other ways, e.g., using fuse or antifuse technology.

Regardless of the type of PLD targeted by a customer design, it is necessary for the PLD user to provide a description of the circuit to be implemented. The user circuit description can be provided, for example, in the form of an HDL (high-level design language) description of the logical functionality of the circuit, a netlist (a listing of low-level circuit elements or gates in the circuit and the interconnections between them), or in some other format such as a configuration data file indicating the exact implementation of the design in the target PLD.

To reduce the time required to implement a user circuit in a PLD, PLD manufacturers often provide pre-designed circuits ("modules," also called cores or macros) that can be included in a customer's design. A module can be included in a design, for example, by including a symbol for the module in a schematic, or by directly instantiating the module in an HDL description or in a netlist.

The design description, which may or may not include module instantiations, is provided by the user to PLD implementation software, which converts the design description to a configuration data file for the targeted PLD. The configuration data file is then used to program the PLD using an appropriate method such as those described above.

System designs often include, in addition to a user circuit, basic control devices such as push-buttons, manual switches, DIP switches, and so forth, which are used to provide input signals to the user circuit. The systems also often include status indicators such as discrete LEDs (light-emitting diodes), 7-segment LED displays, liquid crystal displays, and so forth, which are used to display output data from the user circuit.

FIG. 1 shows a typical system design. The system of FIG. 1 includes a PLD 100 in which a user circuit 101 has been implemented, external control input devices 102, and external status output devices 103. A first communication link 104 provides a communication channel through which external control input devices 102 provide input data to user circuit 101. A second communication link 105 provides a communication channel through which external status output devices 103 receive output data from user circuit 101.

PLD 100, input devices 102, and output devices 103 are separately mounted on a printed circuit (PC) board. Communication links 104, 105 are implemented using traces manufactured as part of the customized PC board. The communication links are coupled to user circuit 101 through device pins (e.g., IOBs) of the PLD and package pins of the PLD package.

The system of FIG. 1 has its limitations. To provide control input data to the user circuit, or to receive status output data from the user circuit, the user must be in the physical presence of the PC board. Communication links 104, 105 pass through device pins (e.g., IOBs) of the PLD and package pins of the PLD package, which often uses device or package pins that are needed for other purposes. The use of external control and status devices consumes significant area on the PC board, both for the devices themselves and for the traces between the PLD and the devices. Thus, the addition of control and status devices increases the cost of the system. The external devices also consume additional power, which is often a factor in system design. Finally, it is not uncommon for a system to require additional control and/or status devices after the system design was presumed complete. Such an alteration requires a modification of the PC board.

These limitations are partially addressed by the provision of Integrated Logic Analyzer cores (ILA modules). ILA modules are implemented in the PLD along with a user circuit. The ILA modules monitor various output signals from the user circuit, analyze the data from the output signals, and provide data pertaining to the output signal values to a host computer system. For example, Xilinx, Inc. provides a ChipScope™ software product that includes a collection of ILA modules. Version 4.1i of the ChipScope software and the accompanying ILA modules are described in detail in the "ChipScope™ Software and ILA Cores User Manual", published Oct. 19, 2001 and available from Xilinx, Inc., which is hereby incorporated herein by reference.

FIG. 2 shows a system that includes a PLD with an ILA module. The system includes a PLD 200, a host computer 210, and a communication link 220 between PLD 200 and host computer 210. Loaded on host computer 210 is ILA software (e.g., the ChipScope software) that can be used to retrieve status output data from the PLD via the communication link. PLD 200 includes three logic blocks implemented using the programmable resources of the PLD. The three logic blocks include user circuit 201, embedded ILA module 202, and embedded communication module 203.

User circuit 201 is a circuit provided by the user, the circuit that the user wishes to monitor. ILA module 202 is a logic block typically provided by the FPGA manufacturer, that provides logic analyzer functions of signals provided by user circuit 201.

Communication module 203 is also typically provided by the FPGA manufacturer, and includes logic that links the ILA module 202 with communications link 220 to the host computer 210. For example, communication module 203 can implement a link between the ILA module and JTAG circuitry already present in the PLD. Communication link 220 also typically includes a direct connection to user circuit 201, i.e., a connection that bypasses communication module 203 and ILA module 202. This connection is shown as a dotted line in FIG. 2.

The system of FIG. 2 provides the ability to monitor output signals from user circuit 201. However, the system of FIG. 2 does not provide the ability to control input signals to the user circuit, e.g., emulating the functions of device 102 of FIG. 1. Therefore, it is desirable to provide systems and methods providing the control functionality of the system of FIG. 1 while addressing one or more of the limitations described above in connection with that figure.

SUMMARY OF THE INVENTION

The invention provides systems and methods utilizing virtual input/output modules (VIO modules) in PLDs. One or more VIO modules are embedded in a PLD along with the user circuit to be controlled and monitored. The VIO module includes a control module that acts as a virtual input module for the user circuit, and can optionally include a status module that acts as a virtual output module for the user circuit. A bi-directional data interface is provided between the user circuit and the VIO modules, and between the VIO modules and a communication module. The communication module is bi-directionally coupled through input/output (I/O) pads of the PLD to an external communication link, and hence to a host computer in which resides software that controls the communication link. Thus, by interfacing with the host computer, a user can control the user circuit via the control modules and monitor output signals from the user circuit via the status modules.

Control modules can include, for example, virtual buttons and switches. Status modules can include, for example, virtual light emitting diode (LED) displays and liquid crystal displays (LCDs). When a field programmable logic device is used, users can reprogram the PLD to use different VIO modules, or to alter the connections to the existing VIO modules to control or display the status of different portions of the user circuit.

A first aspect of the invention provides a system that includes a communication link, a PLD coupled to the communication link, and a host computer that includes software for interfacing with the PLD via the communication link. The PLD is configured to implement a user circuit, a virtual input/output (VIO) module bi-directionally coupled to the user circuit, and a communication module bi-directionally coupled to the VIO module and to the communication link. The VIO module includes a control module for the user circuit. In some embodiments, the communication link has a further electrical connection with the user circuit that bypasses the communication module and the VIO module. In some embodiments, the PLD includes another logic circuit that is also coupled to the communication link.

A second aspect of the invention provides a PLD that includes I/O pads, a user circuit implemented in the PLD, a VIO module implemented in the PLD and bi-directionally coupled to the user circuit, and a communication module implemented in the PLD and bi-directionally coupled to the VIO module and the I/O pads. The VIO module includes a control module for the user circuit.

A third aspect of the invention provides a data communication medium storing a configuration file for a PLD, where the configuration file configures the PLD substantially as described above.

Other aspects of the invention provide methods of implementing systems similar to those described above. Additional exemplary methods include loading software to the host computer for interfacing with the communication module via the communication link, activating the communication link, providing control input data to the user circuit via the host computer, and/or retrieving status output data from the user circuit via the host computer.

BRIEF DESCRIPTION OF THE DRAWINGS

The present invention is illustrated by way of example, and not by way of limitation, in the following figures.

DETAILED DESCRIPTION OF THE DRAWINGS

The present invention is applicable to a variety of programmable logic devices (PLDs). The present invention has been found to be particularly applicable and beneficial for systems including field programmable logic devices (FPGAs). However, the present invention is not so limited.

Figure 2:
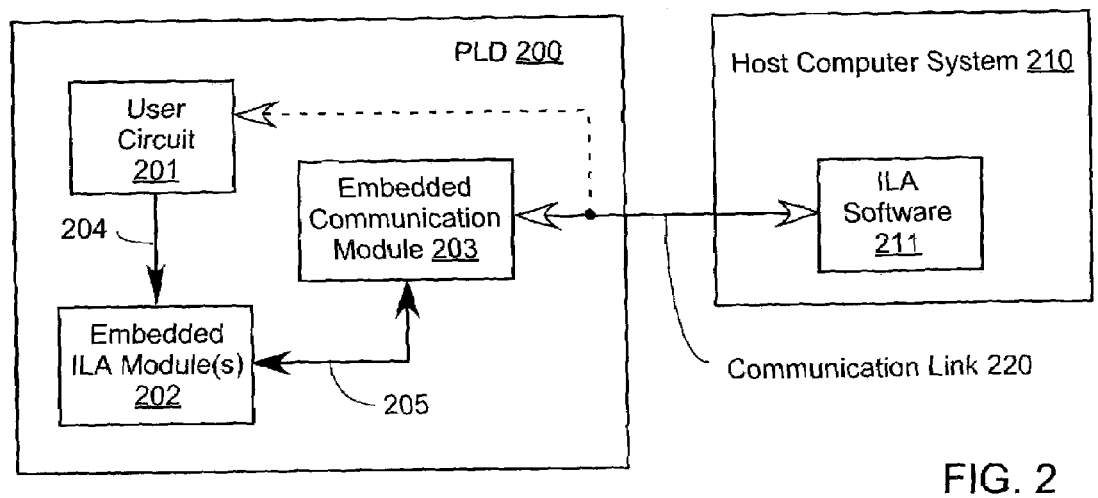
FIG. 2 is a block diagram of a prior art programmable system in which Integrated Logic Analyzer (ILA) modules are instantiated within a PLD.
Figure 3:
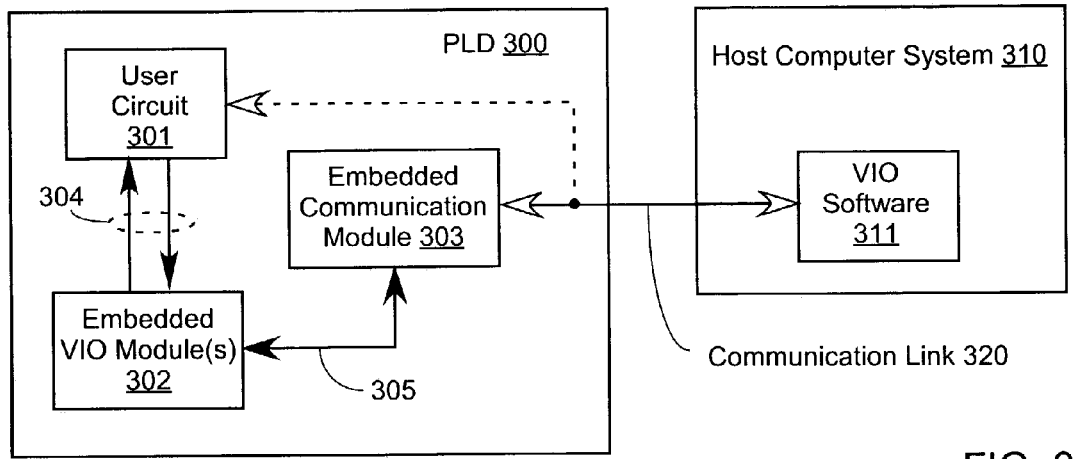
FIG. 3 is a block diagram of a programmable system in which Virtual Input/Output (VIO) modules are instantiated within a PLD according to an embodiment of the invention.

FIG. 3 illustrates a system according to one embodiment of the invention. The system of FIG. 3 is similar to that of FIG. 2, but includes some important differences. The system of FIG. 3 includes Virtual Input/Output (VIO) modules 302 instead of the Integrated Logic Analyzer (ILA) modules 202 provided by the prior art. Further, in the system of FIG. 3, the one-way connection between ILA module 202 and user circuit 204 in FIG. 2 is replaced by a bi-directional interface 304 between VIO module 302 and user circuit 301. Bi-directional interface 304 provides to the system capabilities that are not present in the prior art system of FIG. 2.

Figure 1:
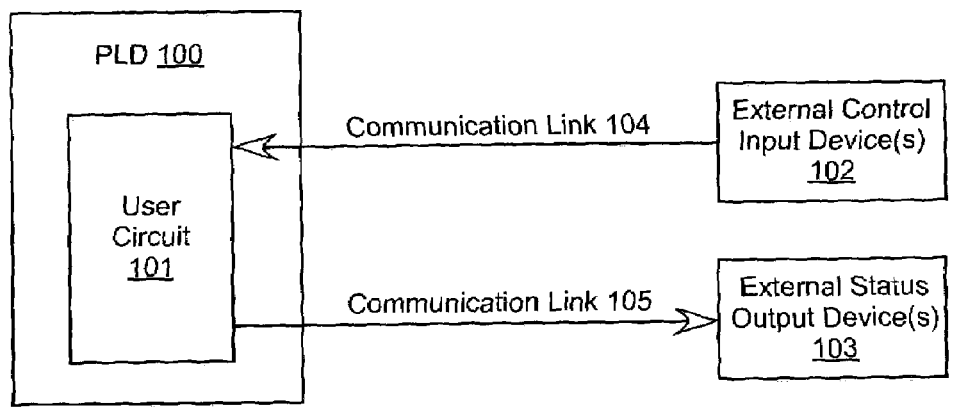
FIG. 1 is a block diagram of a prior art programmable system that includes external control input and status output devices.

The system of FIG. 3 includes a PLD 300, a host computer 310, and a communication link 320 between PLD 300 and host computer 310. Loaded on host computer 310 is virtual input/output (VIO) software 311 that can be used to provide control input data and optionally retrieve status output data from the PLD via the communication link. VIO software 311 can include, for example, a number of standard user interfaces that allow the user to interact with the user circuit in ways similar to the ways they interact with the devices shown in FIG. 1.

(The term "communication link" as used herein includes but is not limited to direct-wired connections (e.g., an IEEE standard 1149.1 JTAG interface), system busses, remote access networks, the internet, intranets, Wide Area Networks (WANs), Local Area Networks (LANs), and transducer links such as those using Modulator-Demodulators (modems). The term "internet" as used herein refers to a wide area data communications network, typically accessible by any user having appropriate software. The term "intranet" as used herein refers to a data communications network similar to an internet but typically having access restricted to a specific group of individuals, organizations, or computers. A communication link can be, for example, a system bus, a wired network, a wireless network connected, for example, by radio or satellite communications, or a combination network.)

PLD 300 includes three logic blocks implemented using the programmable resources of the PLD. (In some embodiments, the three logic blocks are not physically distinct from each other as shown in FIG. 3.) The three logic blocks include user circuit 301, embedded VIO module 302, and embedded communication module 303.

User circuit 301 is a circuit provided by the user, the circuit that the user wishes to control and optionally monitor.

Figure 4:
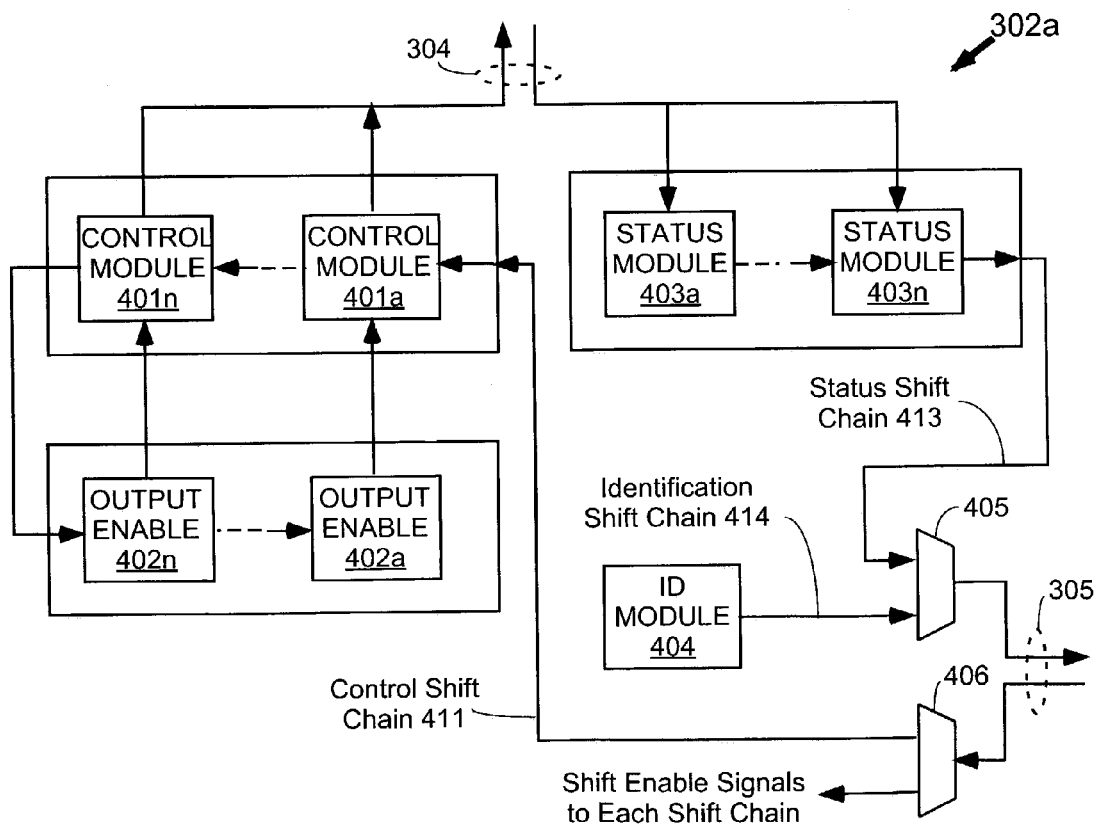
FIG. 4 is a block diagram of an asynchronous VIO module according to an embodiment of the invention.
Figure 5:
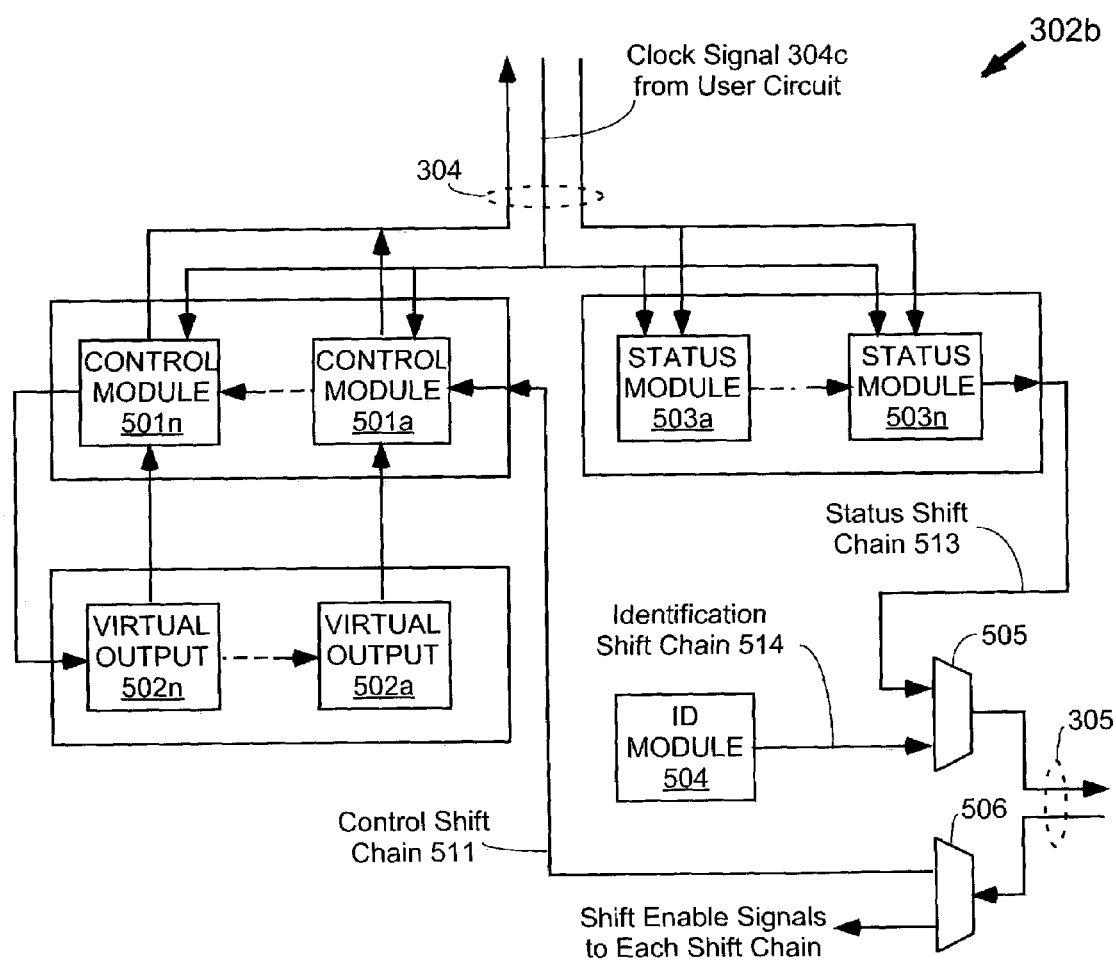
FIG. 5 is a block diagram of a synchronous VIO module according to an embodiment of the invention.

VIO module 302 is a logic block (e.g., provided by the FPGA manufacturer) that provides VIO connections to the user circuit 301. VIO module 302 provides the control input and status output functions previously provided by blocks 102 and 103 of FIG. 1. An exemplary asynchronous VIO module is shown in FIG. 4, and an exemplary synchronous VIO module is shown in FIG. 5. These embodiments are described later in this document in conjunction with these figures.

In some embodiments, a control module within VIO module 302 accepts input signals from the user in a serial format. (The input signals are provided via communication link 320 and communication module 303.) The control module shifts the serial signal through an internal shift chain, and provides the signals in parallel to the user circuit (i.e., acts as a serial to parallel converter). In other embodiments, the control module acts as a parallel to serial converter, or functions in a serial-to-serial or parallel-to-parallel manner.

Figure 4A:
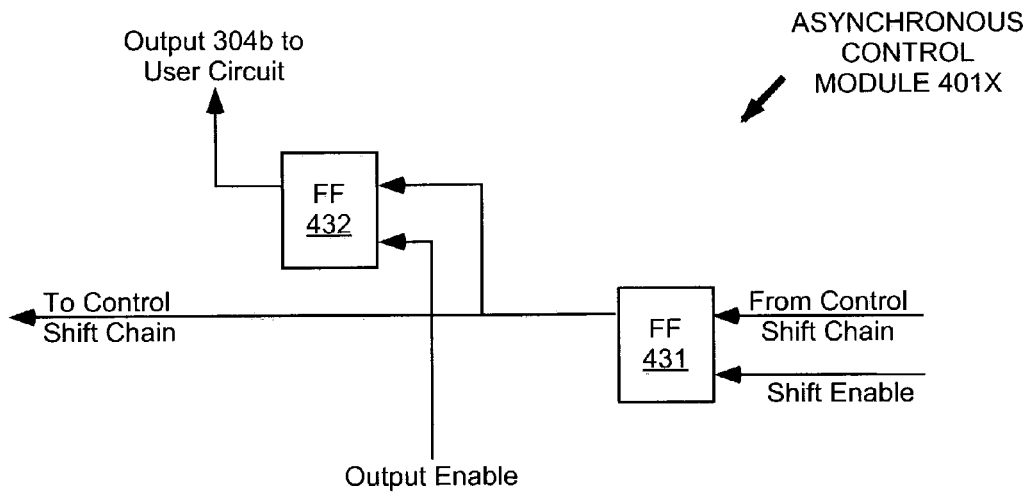
FIG. 4A provides an exemplary control module design for the asynchronous VIO module of FIG. 4.
Figure 5A:
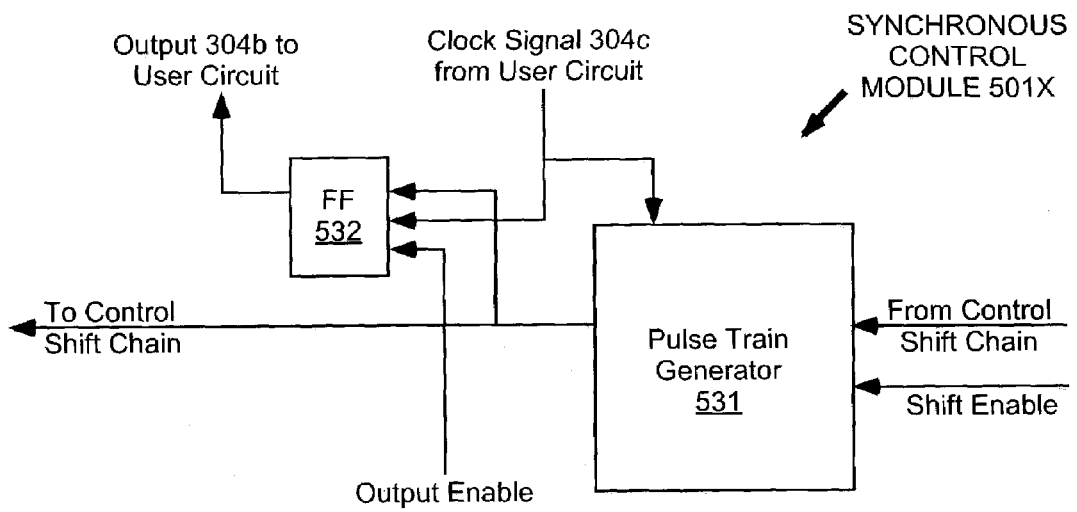
FIG. 5A provides an exemplary control module design for the synchronous VIO module of FIG. 5.

In some embodiments, a control module accepts a single input signal from the user that triggers the generation of a series of pulses, which the control module provides to the user circuit under control of a clock signal from the user circuit. This capability allows for the operation of the user circuit at a clock rate that can be higher than the clock rate supported by communication link 320. Many other types of control modules can be used. Exemplary asynchronous and synchronous control modules are shown in FIGS. 4A and 5A, respectively, and are described later in this document in conjunction with these figures.

Figure 4B:
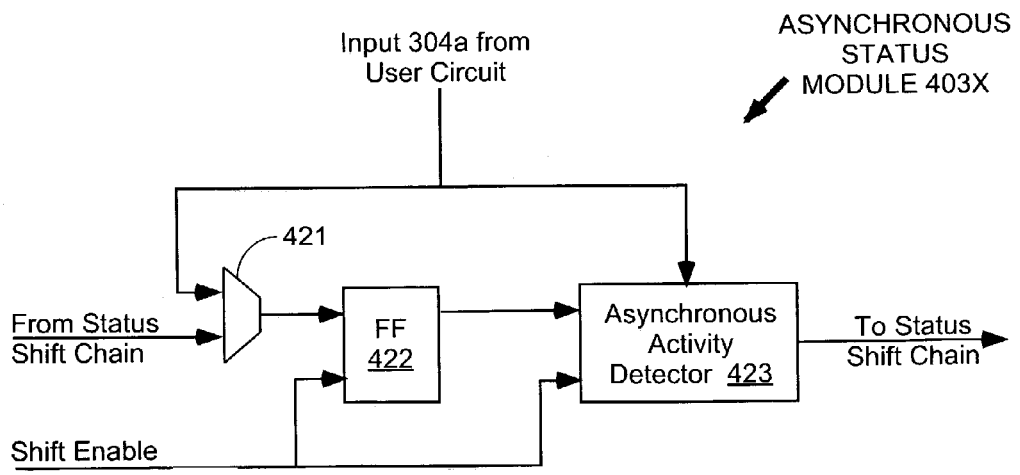
FIG. 4B provides an exemplary status module design for the asynchronous VIO module of FIG. 4.
Figure 5B:
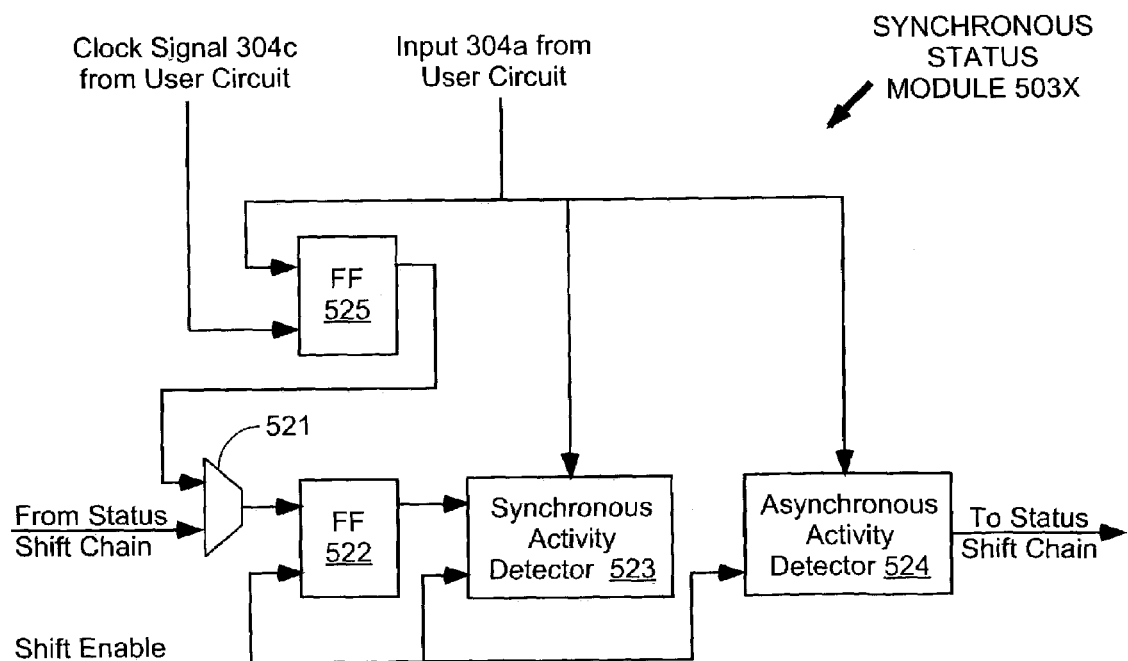
FIG. 5B provides an exemplary status module design for the synchronous VIO module of FIG. 5.

In some embodiments, a status module within VIO module 302 emulates the functionality of a 7-segment LED or LCD display, encoding the display information for eventual transmittal and display on host computer 310. In some embodiments, a status module within VIO module 302 monitors a signal provided by user circuit 301, counting a number of active edges on the signal and storing the number in an internal counter until the value is retrieved by the user via host computer 310 and the counter is reset. Many other types of status modules can be used. Exemplary asynchronous and synchronous status modules are shown in FIGS. 4B and 5B, respectively, and are described later in this document in conjunction with these figures.

Communication module 303 can also be provided by the FPGA manufacturer, and includes logic that links the VIO modules 302 with communications link 320 to the host computer 310. In one embodiment, communication module 303 implements a link between the VIO module and JTAG circuitry already present in the PLD. In this embodiment, communication link 320 uses the JTAG I/O pads included in the PLD, and none of the user-programmable I/O resources are consumed.

In some embodiments, communication link 320 also includes a direct connection to user circuit 301, i.e., a connection that bypasses communication module 303 and VIO module 302. (This optional connection is shown as a dotted line in FIG. 3.) In embodiments where the VIO module is only used for initial system debug, for example, this direct connection can be used after debug to couple the user circuit to the host computer for other purposes.

The system of FIG. 3 has several advantages over the prior art system of FIG. 2. For example, by implementing communication link 320 as an internet connection, a user can perform all of the control functions that previously required the user's physical presence at the site of the system. In fact, because all communication between the user and the VIO modules is via the host computer, as long as the host computer has an internet connection (not shown), the user can remotely utilize the VIO modules to control and monitor the user circuit. As another example, when the PLD is in a test environment, such as undergoing high temperature testing, the user can control and monitor the user circuit without entering the artificial environment to which the PLD is being subjected.

Further, the links between the VIO module and the user circuit do not pass through the I/O pads of the PLD. Thus, the control functions provided by the VIO modules can be much faster than those provided by prior art systems. For example, the control modules can provide predefined "bursts" of data in response to a single input signal, as described above. Similarly, the status modules can include logic that collects data from the user circuit on an ongoing basis and stores and evaluates the data, transmitting, for example, only an "error" or "no error" status bit to the host computer. Thus, the amount of time spent on data transmission can be greatly reduced.

The VIO modules can also include any other type of desired logic, for example, the ability to detect whether or not status output data from the user circuit has changed since the last time the VIO module was accessed by the host computer.

When the PLD is field programmable (e.g., an FPGA), the VIO modules can be used to debug the user circuit. If a status module shows the expected output, but the user circuit still is not functioning properly, the control module can be used to alter the input signals being provided to the user circuit. Additionally or alternatively, the VIO module can be changed to monitor the functions of another portion of the user circuit, or to monitor different functions of the same portion of the user circuit.

FIG. 4 shows an asynchronous VIO module 302a according to one embodiment of the invention. VIO module 302a includes one or more control modules 401a–401n, one or more status modules 403a–403n, and an identification (ID) module 404. Output enable blocks 402a–402n control when control modules 401a–401n are allowed to write data to the user circuit via interface 304.

VIO module 302a includes three shift chains. A control shift chain 411 moves from interface 305 through an input demultiplexer 406, through control modules 401a–401n, and then through the output enable blocks 402n–402a. A status shift chain 413 moves through status modules 403a–403n to multiplexer 405, and hence to interface 305. An identification shift chain 414 moves through ID module 404 to multiplexer 405, and hence to interface 305. Demultiplexer 406 also serves to provide enable signals that shift data through each of the various shift chains. The shift enable signals can be one signal or three separate signals, one for each shift chain.

ID module 404 includes stored constants that describe the makeup of VIO module 302a, such as the number of input and output signals, and the type of each. In some embodiments, these constants can be serialized and shifted out of the module using the identification shift chain. The format of the identification data is defined by the particular implementation of the ID module, and thus is known to the VIO software (311 in FIG. 3). The VIO software can decode the information and set up the software data structures accordingly. For example, in a system including several PLDS, the VIO software can use the ID modules to perform the following series of tasks: detect all the devices in the ID shift chain; identify which devices in the chain might include VIO modules; send detection commands to the identified devices to determine the various stored parameters for the VIO modules included therein; and construct data structures that reflect the parameters contained in the retrieved identification data.

The output shift chain is used to configure the control signals provided by the VIO module to the user circuit. The control signals to be provided to the user circuit are presented to demultiplexer 406 and shifted into control modules 401a–401n and output enable blocks 402n–402a. The outputs are then provided to the user circuit by control modules 401a–401n under control of the output enable blocks 402n–402a.

FIG. 4A shows one embodiment 401X of asynchronous control modules 401a–401n. Each control module 401X includes a first flip-flop 431 that is part of the output shift chain, and a second flip-flop 432 that is used to load values into the user circuit. Because control module 401X is asynchronous (i.e., there is no user clock signal to use as a reference), no pulse train capability is provided.

The input shift chain is used to capture the state of signals in the user circuit. User signals from interface 304 are captured and can be monitored, for example, for changes in state.

FIG. 4B shows one embodiment 403X of asynchronous status modules 403a–403n. Each status module 403X includes a flip-flop 422 on the status shift chain. The flip-flop is driven by either the status chain input signal, or a new input signal 304a from the user circuit. The selection of input signals is controlled by multiplexer 421. The flip-flop output signal is then provided to asynchronous activity detector 423, which also forms part of the status shift chain.

Asynchronous activity detector 423 can monitor input signal 304a, for example, to detect whether or not input signal 304a has changed state since the last value was captured. For example, if signal 304a is a "0" value when sampled, then changes to "1" and back again to "0" before the next sample is taken, the user might have no knowledge that the signal has changed state. Asynchronous activity detector 423 will capture this information.

FIG. 5 shows a synchronous VIO module 302b according to one embodiment of the invention. The embodiment of FIG. 5 is similar to that of FIG. 4, but includes a clock signal 304c provided by the user circuit as part of interface 304. Clock signal 304c is provided to both the control modules and the status modules of VIO module 302b.

FIG. 5A shows one embodiment 501X of synchronous control modules 501a–501n. Control module 501X is similar to control module 401X of FIG. 4A, but flip-flop 431 has been replaced by pulse train generator 531, which is clocked by clock signal 304c provided by the user circuit. Pulse train generator 531 allows the user to define a sequence of 0's and 1's to be output from the VIO module on successive clock edges.

FIG. 5B shows one embodiment 503X of synchronous status modules 503a–503n. Status module 503X is similar to status module 501X of FIG. 5A, but a synchronous activity detector 523 is added. Synchronous activity detector 523 is clocked by clock signal 304c, and detects changes in input signal 304a only on rising edges of clock signal 304c. Flip-flop 525 is also added prior to multiplexer 521 to synchronize input signal 304a to clock signal 304c.

FIGS. 4–5B show particular embodiments of asynchronous and synchronous VIO modules. However, VIO modules 302a and 302b represent only two of many possible embodiments of VIO module 302 of FIG. 3.

Figure 6:
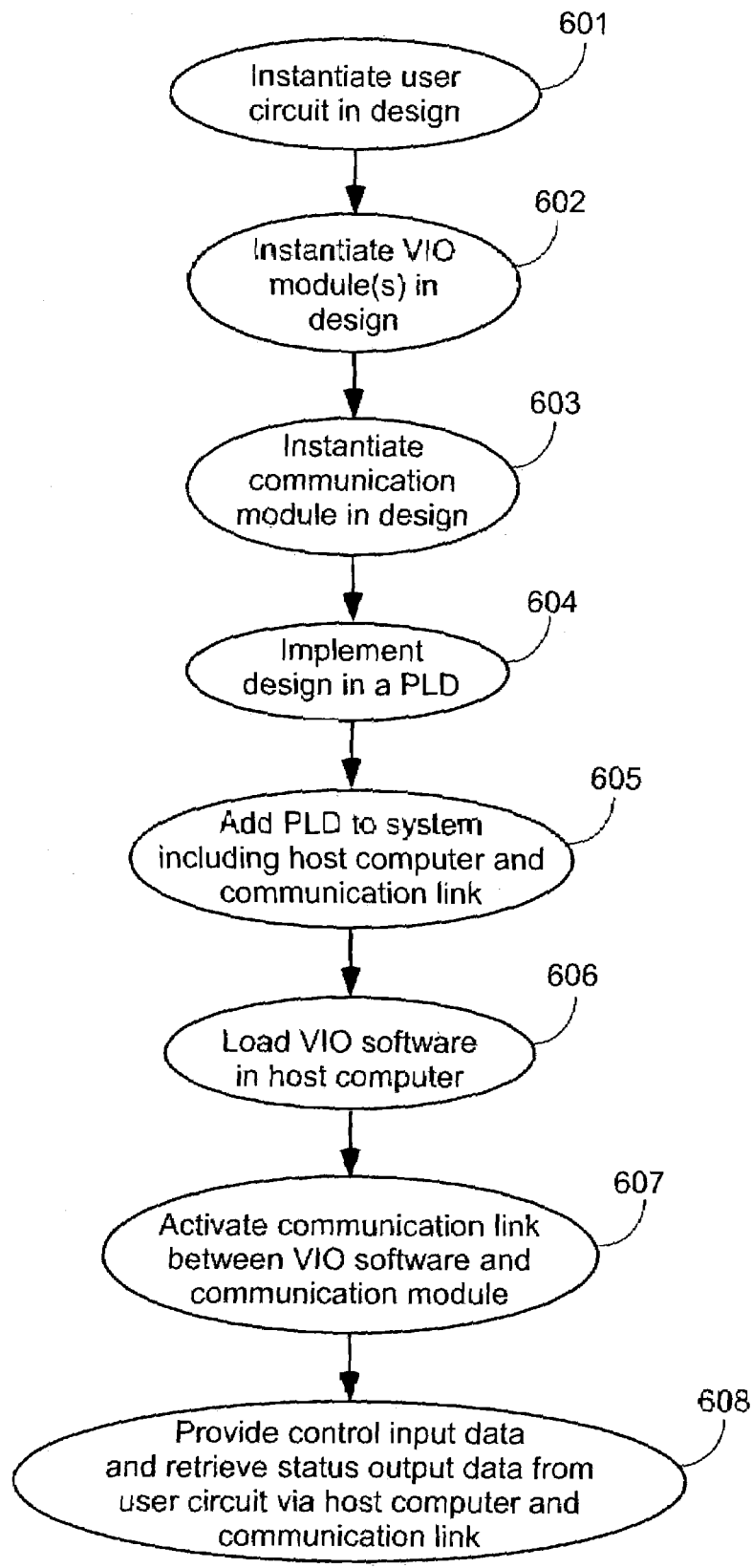
FIG. 6 illustrates the steps of a method of implementing a programmable system that includes virtual control input and status output modules.

To create and utilize the system of FIG. 3, a user can follow, for example, the series of steps illustrated in FIG. 6. In step 601, the user circuit is instantiated in a design. The design can be, for example, in the form of a schematic entered using one of the many well-known schematic entry software tools, or an HDL (high-level design language) textual description of the logical functionality of the circuit.

In step 602, one or more VIO modules are instantiated in the design. In one embodiment, where the design is in the form of a schematic, the user instantiates the VIO module by placing a symbol into the schematic, where the symbol represents one of a set of existing VIO modules supplied by the FPGA manufacturer. In another embodiment, a single symbol represents a single VIO module provided by the FPGA manufacturer, which VIO module is parameterized by the user to select one of the set of supported VIO functions. In these embodiments, instantiating the VIO module includes drawing nets that couple the ports of the VIO module to the desired nodes in the user circuit.

In another embodiment, where the design is in the form of a textual listing such as an HDL file, the VIO module is instantiated by including a direct statement of instantiation (essentially a textual incorporation by reference) into the textual listing. The statement of instantiation includes information as to how the various ports of the VIO module are coupled to the user circuit, i.e., specifies the nodes in the user circuit to which each port of the VIO module is coupled.

In other embodiments, a user can instantiate a VIO module by setting a software parameter, by interactively specifying desired display modes, or using some other method.

In step 603, the communication module is instantiated in the design. In some embodiments, this step is performed by the user in a fashion similar to that described in conjunction with step 602. In other embodiments, the necessity for this step is inferred by the PLD implementation software, and the PLD implementation software performs this step in conjunction with step 604.

In step 604, the design is implemented in a PLD by creating a configuration data file using PLD implementation software and downloading the configuration data file to the PLD. The result of this step can be, for example, PLD 300 as illustrated in FIG. 3. In step 605, the PLD is added to a system that includes a host computer and a communication link between the PLD and the host computer, as shown in FIG. 3. In step 606, software is loaded into the host computer that uses the communication link to interface with the communication module in the PLD. In step 607, the communication link is activated. In step 608, the user provides control input data and/or retrieves status output data from the user circuit via the host computer and the communication link.

The steps shown in FIG. 6 can be performed in an order other than the order shown. For example, when the PLD is an FPGA, the PLD is typically added to the system (step 605) prior to programming the PLD (described as part of step 604). When the PLD is an ASIC or a fuse or anti-fuse device, a PLD is programmed prior to adding the PLD to a system, as shown. Steps 601, 602, and 603 can be performed in any order. Step 606 can be performed at any point in the process prior to step 607.

The system of FIG. 3 can be used in many other ways. For example, VIO modules can be altered after manufacture of the system simply by altering the design to change the VIO module (see step 602 of FIG. 6), and re-implementing the design in the PLD (step 604). Similarly, VIO modules can be removed after manufacture of the system simply by altering the design to remove the VIO module, then re-implementing the design in the PLD. Alternatively or additionally, connections between the status input signals to the VIO module and the user's design can be altered without re-implementing the design. For example, commercially available software tools such as the FPGA Editor tool from Xilinx, Inc., can be used to make these alterations. In some embodiments, similar changes can be made to the control signals.

Figure 7:
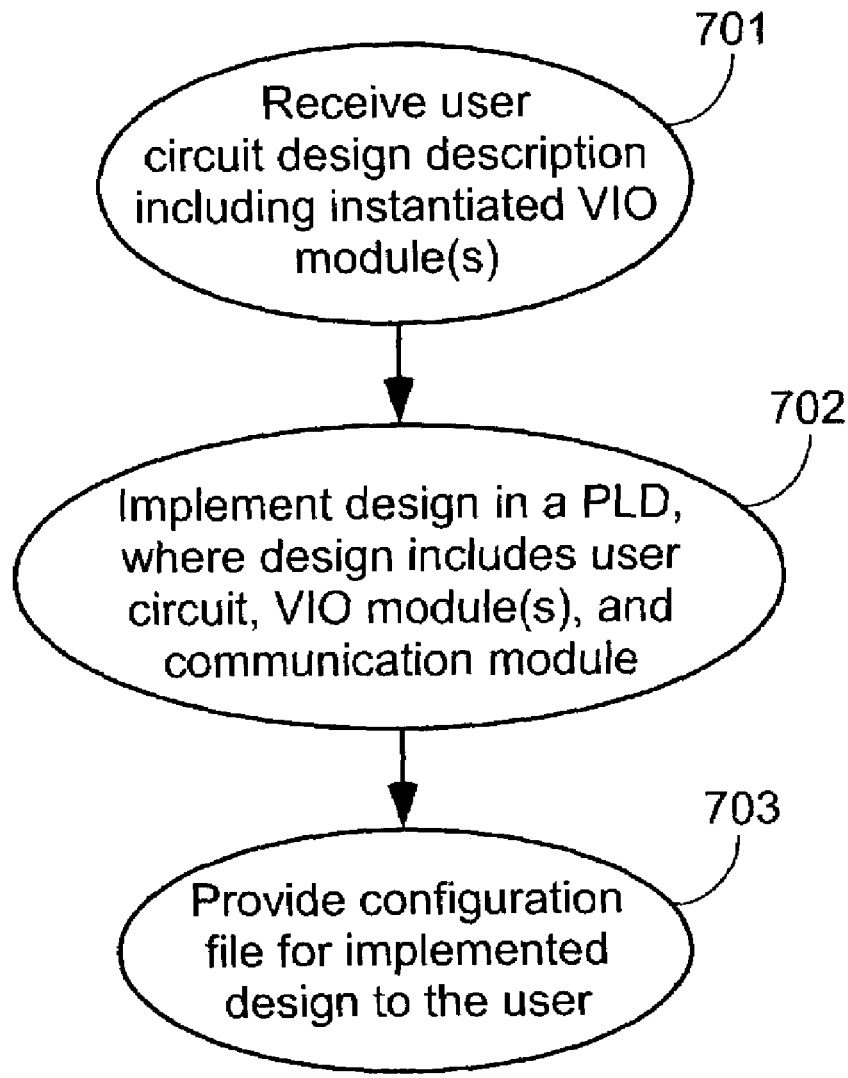
FIG. 7 illustrates the steps of a method of implementing in a PLD a user circuit and associated virtual control input and status output modules.

FIG. 7 shows the steps of a method of implementing in a PLD a user circuit and associated virtual control input and status output modules. In step 701, a user circuit design description is received that includes an instantiated VIO module. The design description might or might not include an instantiation of a communication module for communicating with the host computer via a communication link. In some embodiments, the instantiation of the communication module is inferred by the PLD implementation software when the VIO module instantiation is detected. In other embodiments, the communication module is already included in one or more VIO modules provided to the user by the PLD manufacturer.

In step 702, the design description is implemented in a PLD, the resulting design including the user circuit, the VIO modules, and the communication module. In step 703, the implemented design is provided to the user in the form of a configuration data file that can be used, for example, to configure a PLD as shown in FIG. 3.

The methods of the present invention can be performed in either hardware, software, or any combination thereof, as those terms are currently known in the art. In particular, the present methods can be carried out by software, firmware, or microcode operating on a computer or computers of any type. Additionally, software embodying the present invention can comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Further, such software can also be in the form of a computer data signal embodied in a carrier wave, such as that found within the well-known Web pages transferred among computers connected to the internet. Accordingly, the present invention is not limited to any particular platform, unless specifically stated otherwise in the present disclosure.

Those having skill in the relevant arts of the invention will now perceive various modifications and additions that can be made as a result of the disclosure herein. For example, the above text describes the systems and methods of the invention in the context of FPGAs such as the Virtex-II FPGA from Xilinx, Inc. However, the systems and methods of the invention can also be implemented using other FPGAs and PLDs other than FPGAs. Accordingly, all such modifications and additions are deemed to be within the scope of the invention, which is to be limited only by the appended claims and their equivalents.

What is claimed is:

1. A system, comprising:
   a communication link;
   a programmable logic device (PLD) configured to implement a user circuit, a virtual input/output (VIO) module bi-directionally coupled to the user circuit and comprising a control module for the user circuit, and a communication module bi-directionally coupled to the VIO module, the communication module being in electrical communication with the communication link; and
   a host computer in electrical communication with the communication link, the host computer including software for bi-directionally interfacing with the communication module via the communication link.

2. The system of claim 1, wherein the PLD is one of a group of PLDs consisting of: a field programmable gate array (FPGA), a complex programmable logic device (CPLD), an application specific integrated circuit (ASIC), a fuse-programmable device, and an anti-fuse programmable device.

3. The system of claim 1, wherein the communication link has a further electrical connection with the user circuit that bypasses the communication module and the VIO module.

4. The system of claim 1, wherein:
   the PLD is further configured to implement another logic circuit; and
   the communication link is further coupled to the another logic circuit.

5. The system of claim 1, wherein the communication link comprises at least one of the following: a direct-wired connection, a system bus, a remote access network, and a wireless network.

6. The system of claim 1, wherein the control module comprises a control shift chain coupled to receive signals from the communication module and to provide the signals to the user circuit.

7. The system of claim 1, wherein the control module comprises a pulse train generator configured to provide a predetermined train of pulses to the user circuit on receipt of a predetermined signal from the communication module.

8. The system of claim 1, wherein the control module is asynchronous.

9. The system of claim 1, wherein the control module is synchronous, the control module having an input clock terminal coupled to receive a clock signal from the user circuit.

10. The system of claim 1, wherein the VIO module further comprises a status module.

11. The system of claim 10, wherein the status module comprises a status shift chain coupled to receive signals from the user circuit and to provide the signals to the communication module.

12. The system of claim 10, wherein the status module comprises an asynchronous activity detector coupled to monitor an output signal from the user circuit.

13. The system of claim 10, wherein the status module comprises a synchronous activity detector coupled to monitor an output signal from the user circuit.

14. The system of claim 10, wherein the status module is synchronous, the status module having an input clock terminal coupled to receive a clock signal from the user circuit.

15. A programmable logic device (PLD), comprising:
a plurality of input/output (I/O) pads;
a user circuit implemented using a first group of programmable resources within the PLD;
a virtual input/output (VIO) module comprising a control module for the user circuit and implemented using a second group of programmable resources within the PLD, the VIO module being bi-directionally coupled to the user circuit; and
a communication module implemented using a third group of programmable resources within the PLD, the communication module being bi-directionally coupled to the VIO module and to the plurality of I/O pads.

16. The PLD of claim 15, wherein the PLD is one of a group of PLDS consisting of: a field programmable gate array (FPGA), a complex programmable logic device (CPLD), an application specific integrated circuit (ASIC), a fuse-programmable device, and an anti-fuse programmable device.

17. The PLD of claim 15, wherein the user circuit has a further electrical connection with the plurality of I/O pads that bypasses the communication module and the VIO module.

18. The PLD of claim 15, wherein the PLD further comprises an additional logic circuit implemented using a fourth group of programmable resources within the PLD, the additional logic circuit having an electrical connection with the plurality of I/O pads that bypasses the communication module and the VIO module.

19. The PLD of claim 15, wherein the communication module implements a JTAG interface.

20. The PLD of claim 15, wherein the control module comprises a control shift chain coupled to receive signals from the communication module and to provide the signals to the user circuit.

21. The PLD of claim 15, wherein the control module comprises a pulse train generator configured to provide a predetermined train of pulses to the user circuit on receipt of a predetermined signal from the communication module.

22. The PLD of claim 15, wherein the control module is asynchronous.

23. The PLD of claim 15, wherein the control module is synchronous, the control module having an input clock terminal coupled to receive a clock signal from the user circuit.

24. The PLD of claim 15, wherein the VIO module further comprises a status module.

25. The PLD of claim 24, wherein the status module comprises a status shift chain coupled to receive signals from the user circuit and to provide the signals to the communication module.

26. The PLD of claim 24, wherein the status module comprises an asynchronous activity detector coupled to monitor an output signal from the user circuit.

27. The PLD of claim 24, wherein the status module comprises a synchronous activity detector coupled to monitor an output signal from the user circuit.

28. The PLD of claim 24, wherein the status module is synchronous, the status module having an input clock terminal coupled to receive a clock signal from the user circuit.

29. A data communication medium storing a configuration data file for a programmable logic device (PLD), the PLD comprising a plurality of programmable resources and a plurality of input/output (I/O) pads, the configuration data file comprising:
a first plurality of bits that configure a first subset of the plurality of programmable resources to implement a user circuit;
a second plurality of bits that configure a second subset of the plurality of programmable resources to implement a virtual input/output (VIO) module comprising a control module for the user circuit and bi-directionally coupled to the user circuit; and
a third plurality of bits that configure a third subset of the plurality of programmable resources to implement a communication module bi-directionally coupled to the VIO module and to the plurality of I/O pads.

30. The data communication medium of claim 29, wherein the PLD is one of a group of PLDs consisting of: a field programmable gate array (FPGA), a complex programmable logic device (CPLD), an application specific integrated circuit (ASIC), a fuse-programmable device, and an anti-fuse programmable device.

31. The data communication medium of claim 29, further comprising a fourth plurality of bits that configure a fourth subset of the plurality of programmable resources to implement an electrical connection between the user circuit and the plurality of I/O pads that bypasses the communication module and the VIO module.

32. The data communication medium of claim 29, wherein the communication module implements a JTAG interface.

33. A method of implementing a system using a programmable logic device (PLD), the system comprising a host computer and a communications link to the host computer, the method comprising:
- instantiating a user circuit in a design;
- instantiating a virtual input/output (VIO) module in the design, the VIO module comprising a control module for the user circuit and being bi-directionally coupled to the user circuit;
- implementing the design in the PLD using PLD implementation software; and
- adding the PLD to the system such that the user circuit is in bi-directional electrical communication with the host computer via the VIO module, the communication module, and the communication link.

34. The method of claim 33, further comprising:
instantiating a communication module in the design.

35. The method of claim 33, further comprising:
loading software to the host computer for interfacing with the communication module via the communication link.

36. The method of claim 35, further comprising:
activating the communication link between the software and the communication module.

37. The method of claim 36, further comprising:
providing control input data to the user circuit via the host computer.

38. The method of claim 36, wherein instantiating a VIO module comprises instantiating a status module, the method further comprising:
retrieving status output data from the user circuit via the host computer.

39. The method of claim 33, wherein the steps of the method are performed in the order presented in the claim.

40. A method of implementing a user circuit in a programmable logic device (PLD), the method comprising:
- receiving a user circuit design description that includes a user circuit description and an instantiated virtual input/output (VIO) module, the VIO module comprising a control module for the user circuit and being bi-directionally coupled to the user circuit;
- implementing the user circuit design description in the PLD to provide an implemented design that includes the user circuit, the VIO module, and a communication module; and
- providing to the user a configuration file for the implemented design.

41. The method of claim 40, further comprising modifying the implemented design to alter connections between the user circuit and the control module without re-implementing the user design.

* * * * *